United States Patent [19]
Kerr

[11] Patent Number: 5,994,210
[45] Date of Patent: Nov. 30, 1999

[54] METHOD OF IMPROVING SILICIDE SHEET RESISTANCE BY IMPLANTING FLUORINE

[75] Inventor: Daniel C. Kerr, Sunnyvale, Calif.

[73] Assignee: National Semiconductor Corporation, Santa Clara, Calif.

[21] Appl. No.: 08/907,935

[22] Filed: Aug. 12, 1997

[51] Int. Cl.$^6$ .................... H01L 21/3205; H01L 21/4763
[52] U.S. Cl. ........................................... 438/592; 438/682
[58] Field of Search ................................... 438/592, 597, 438/682, 683

[56] References Cited

U.S. PATENT DOCUMENTS

| | | | |
|---|---|---|---|
| 3,986,903 | 10/1976 | Watrous, Jr. | 148/187 |
| 4,514,251 | 4/1985 | Van Ommen et al. | 156/628 |
| 4,603,472 | 8/1986 | Schwabe et al. | 29/576 B |
| 4,613,882 | 9/1986 | Pimbley et al. | 357/23.3 |
| 4,837,179 | 6/1989 | Foster et al. | 437/44 |
| 5,444,024 | 8/1995 | Anjum et al. | 437/200 |
| 5,508,212 | 4/1996 | Wang et al. | 437/24 |
| 5,712,196 | 1/1998 | Ibok | 437/200 |

OTHER PUBLICATIONS

Chen, et al., Ti–Salicide Improvement By Preamorphization For ULSI Applications, *Mat. Res. Soc. Symp. Proc.*, vol. 402, pp. 89–94 (1996).

Xiao, et al., TiSi$_2$ Thin Films Formed on Crystalline And Amorphous Silicon, *Mat. Res. Soc. Symp. Proc.*, vol. 181, pp. 167–172 (1990).

Mogul, et al., Advantages of LDD–Only Implanted Flourine With Submicron CMOS Technologies, *IEEE Transactions On Electron Devices*, vol. 44, No. 3, pp. 388–394 (Mar. 1997).

Fujii, et al., Sub–Quarter Micron Titanium Salicide Technology With In–Situ Silicidation using High–Temperature Sputtering, *Symposium on VLSI Technology Digest Of Technical Papers*, NEC Corporation, pp. 57–58 (1995).

Kittl, et al., A Ti Salicide Process for 0.10 $\mu$m Gate Length CMOS Technology, *Symposium On VLSI Technology Digest of Technical Papers*, Texas Instruments Incorporated, pp. 14–15 (1996).

Sakai, et al., A New Salicide Process (PASET) For Sub–half Micron CMOS, *Symposium On VLSI Technology Digest Of Technical Papers*, NEC Corporation, pp. 66–67 (1992).

*Primary Examiner*—Richard Booth
*Assistant Examiner*—Walter L. Lindsay, Jr.
*Attorney, Agent, or Firm*—Limbach & Limbach L.L.P.

[57] ABSTRACT

Sheet resistance of titanium silicide formed on silicon is diminished by enhancing formation of nucleation sites for the C-54 phase. Fluorine is introduced into silicon by either the implantation of BF$_2$ or F, followed by creation of a cap oxide over the silicon surface. During subsequent annealing, fluorine outgasses, forming bubbles in the silicon. Upon removal of the cap oxide, the gas escapes and the silicon surface is pitted and uneven, enhancing subsequent formation of C-54 nucleation sites.

12 Claims, 8 Drawing Sheets

METHOD OF IMPROVING SILICIDE SHEET RESISTANCE BY IMPLANTING FLUORINE

BACKGROUND OF THE INVENTION

1. Field of the Invention

The present invention relates to a process for improving the silicide sheet resistance of titanium silicide formed upon silicon. Specifically, fluorine is implanted into N+ doped regions of silicon and annealed under a cap oxide, resulting in enhancement of nucleation site density for the subsequent transformation into C-54 phase titanium silicide.

2. Description of the Related Art

With the decreased size of semiconductor devices, the sheet resistivity of the electrically-conducting structures of these devices, such as the gates of MOS transistors, emitters of bipolar transistors, local interconnect regions of MOS and bipolar transistors, and interconnect lines connecting these devices together, is beginning to limit the speed of operation.

One well-known technique for reducing sheet resistivity is to form a layer of metal silicide over these electrically-conducting structures. The resulting silicided structures provide the lower resistivity of a metal silicide, along with the well-known attributes of silicon.

Figure 1:
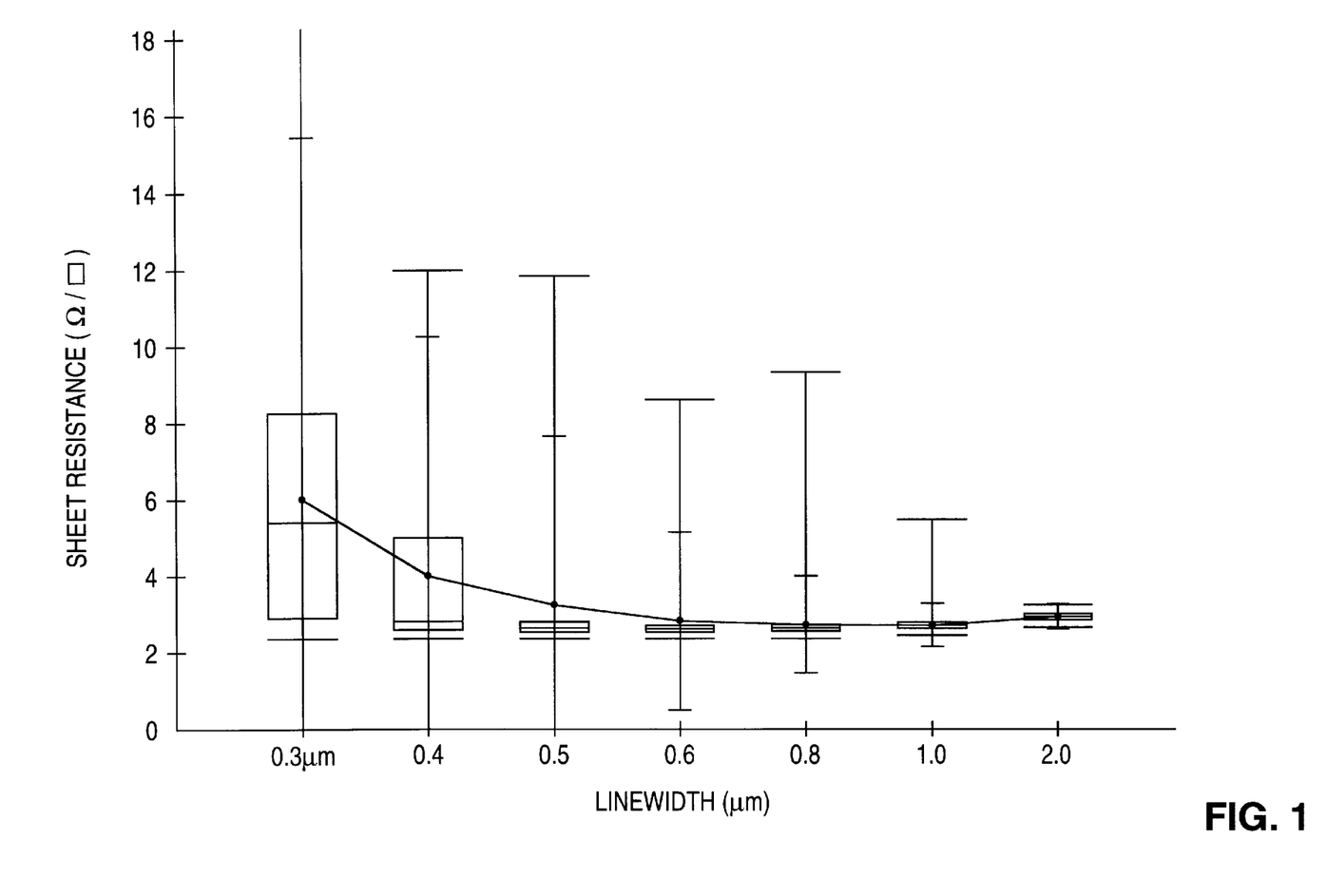
FIG. 1 is a graph showing the increase in sheet resistance of $TiSi_2$ with decreasing line width.

$TiSi_2$ is one of the most extensively utilized metal silicides. A major problem with forming $TiSi_2$, however, is that sheet resistance increases strongly for N+-doped silicon with decreasing linewidth. The relationship between sheet resistance and linewidth for $TiSi_2$ is shown in FIG. 1.

At least two distinct phases of $TiSi_2$ have been recognized. These phases are known as C-49 and C-54. C-49 $TiSi_2$ exhibits substantially higher sheet resistance than the C-54 phase. FIG. 1 can therefore be explained by a nucleation and growth model.

Figure 2A:
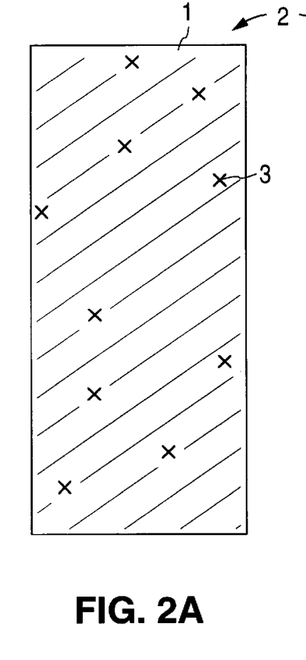
FIGS. 2A–2C shows a surface view of a silicon linewidth illustrating the nucleation and growth model for $TiSi_2$.
Figure 2B:
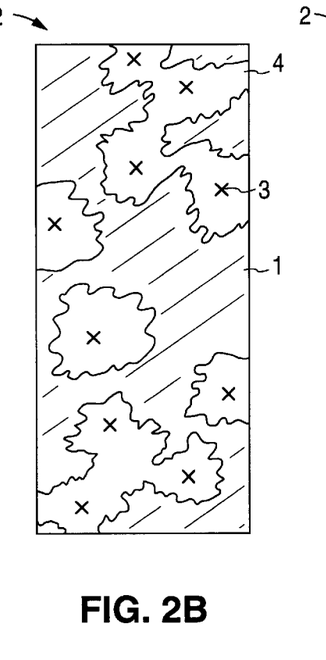
Figure 2C:
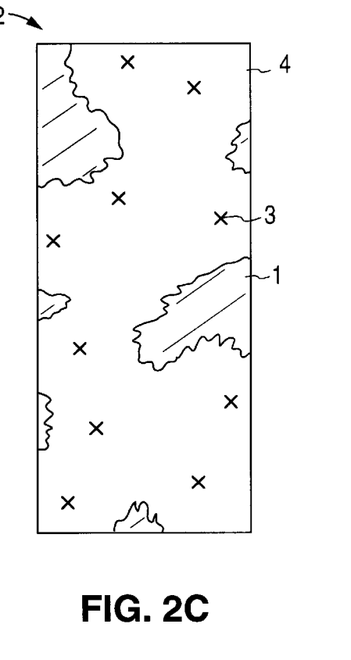

FIG. 2 illustrates this nucleation and growth model. As shown in FIG. 2A, C-49 phase 1 is initially formed upon the surface of linewidth 2, along with C-54 nucleation sites 3. FIG. 2B shows that upon further reaction, C-54 phase 4 grows at nucleation sites 3. FIG. 2C shows the ultimate result wherein growth areas of C-54 phase 4 merge to form a continuous region of C-54 having lower sheet resistance. Because C-54 phase nucleation site density is dependent upon linewidth, narrower linewidths yield fewer nucleation sites from which the lower resistive C-54 phase can grow.

Improved processes have been proposed to promote formation of $TiSi_2$ having low sheet resistances. Sakai, et al. (1992 VLSI Tech. Dig. 66) describe implanting As into both the N+ and P+ regions of a CMOS structure prior to silicide metal implantation, causing pre-amorphization of the silicon. Titanium is then applied to the amorphous silicon, followed by a sequential two-step sintering process in which C-49 phase is created and converted into C-54 phase. Fujii, et al. (1995 VLSI Tech. Dig. 57) describe enhancement of the Sakai process utilizing high-temperature sputtering of titanium.

Several groups have investigated the physical basis underlying these pre-amorphization techniques. Chen, et al. (1996 Mat.Res.Symp.Proc. 89) suggest that pre-amorphization does not increase the rate of conversion of C-49 to C-54, but instead enhances the reaction rate between Ti and loosely bound amorphous silicon, resulting in C-54 having larger grains and lower resistivity. Kittl, et al. (1996 VLSI Tech. Dig. 14) suggest that pre-amorphization causes formation of C-49 silicide having a grain size smaller than the linewidth. Xiao, et al. (1990 Mat.Res.Soc.Proc. 167) have suggested that pre-amorphization utilizes latent energy stored in amorphous silicon to enhance the kinetics of the C-54 phase transformation reaction.

The pre-amorphization techniques discussed above have been somewhat successful in lowering sheet resistance on silicided surfaces. However, pre-amorphization techniques remain experimental. The process in accordance with the present invention utilizes the conventional siliciding process with the addition of a single fluorine implant step to enhance formation of C-54 phase titanium silicides at the extremely narrow linewidths demanded by modern devices.

SUMMARY OF THE INVENTION

The process in accordance with the present invention is a method for promoting formation of C-54 phase titanium silicide in N+ doped silicon regions. Specifically, fluorine is implanted into the N+ doped silicon regions, followed by annealing of the N+ doped regions underneath a cap oxide. Outgassing of fluorine during the annealing process create pits at the surface of the N+ doped silicon regions. These pits increase nucleation site density for formation of the C-54 phase of the $TiSi_2$, resulting in more widespread growth of C-54 phase silicide having decreased sheet resistance.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIGS. 5A-1 to 5I-2 show the conventional process of formation of titanium silicide.

FIGS. 7A-1 to 7J-2 show the process of formation of titanium silicide in accordance with one embodiment of the process in accordance with the present invention.

DETAILED DESCRIPTION

Figure 3:
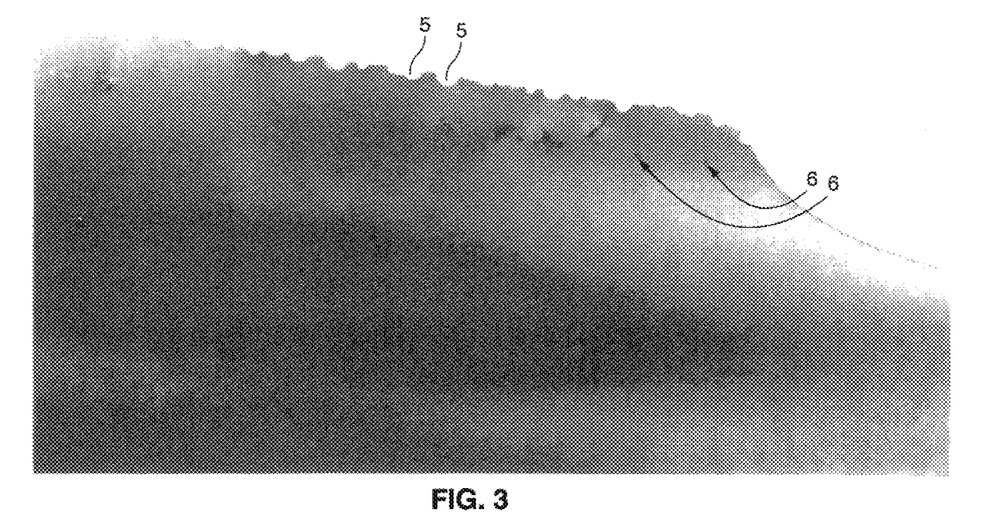
FIG. 3 shows a TEM photo at 260,000× of a cross section of P+ doped silicon after $BF_2$ implantation at 25 keV with a dosage of $5 \times 10^{15}$ ions $/cm^2$, followed by annealing under a cap oxide.

It has been observed that implantation of $BF_2$ into P+ regions of silicon, followed by annealing with a cap oxide, results in a pitted and uneven surface in the P+ region. FIG. 3 shows a TEM photo of a P+ doped silicon surface following $BF_2$ implantation at 25 keV with a dosage of $5 \times 10^{15}$ ions $/cm^2$, followed by annealing under a cap oxide. Pits 5 and cavities 6 are created by outgassing of fluorine that has disassociated from the implanted $BF_2$; fluorine can etch both silicon and silicon oxide.

Implantation of fluorine is a well-known technique. Mogul, et al. (1997 IEEE 387) report the implantation of fluorine to prevent deep junctions and to improve oxide quality. Moreover, the average sheet resistance and variability of narrow P+ regions doped with B alone is higher than that of P+ regions doped with $BF_2$. Therefore, in accordance with one embodiment of the present invention, fluorine is implanted into N+ doped regions of a silicon surface, generating a pitted surface similar to that shown in FIG. 3, and lowering the sheet resistance of silicided N+ doped regions.

Figure 4:
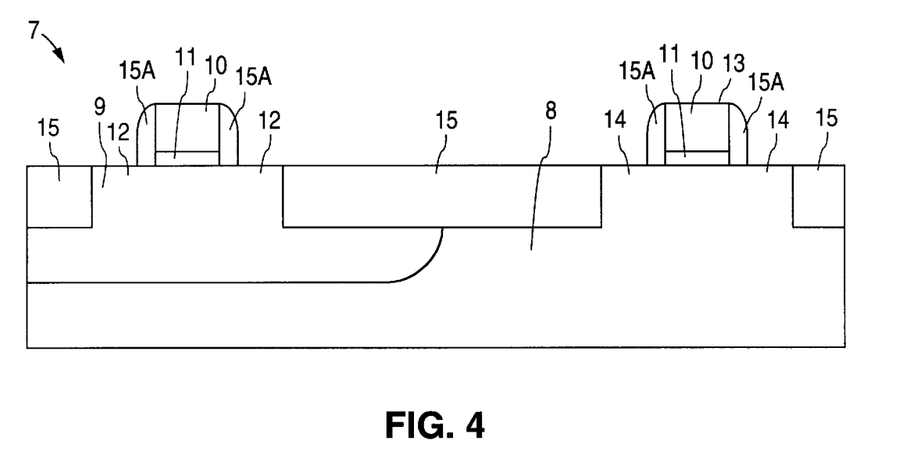
FIG. 4 shows the precursor CMOS structure forming a starting point for the conventional process as well as the process of the present invention.

FIG. 4 is a cross-sectional drawing illustrating the CMOS precursor structure 7 forming the starting point for the conventional titanium silicide forming process. Precursor CMOS structure 7 is comprised of lightly P doped silicon substrate 8 having lightly N doped well 9. Gate 10, formed from silicon, is separated from N well 9 by gate oxide 11. Precursor source/drain regions 12 composed of silicon are located on either side of gate 10. Similarly, gate 13 formed from silicon, is separated from substrate 8 by gate oxide 11. Precursor source/drain regions 14 composed of lightly P doped silicon are located on either side of gate 13. Precursor CMOS structure 7 also has field oxides 15, and spacer oxides 15A.

Figure 5A:
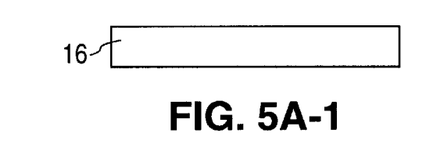
Figure 5A:
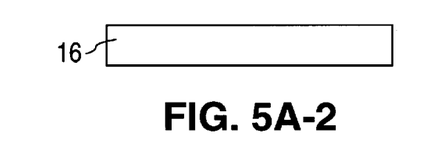

FIGS. 5A-1 to 5I-2 shows the conventional process for forming titanium silicide. FIGS. 5A-1 to 5I-2 show the sequence of modifications made to silicon regions 10, 12, 13 and 14 of FIG. 4. As shown in FIG. 5A-1, gate 10 or precursor source/drain regions 12 are generically indicated by left silicon cross-section 16. FIG. 5A-2 shows gate 13 or precursor source/drain regions 14 are generically indicated by right silicon cross-section 16.

Figure 5B:
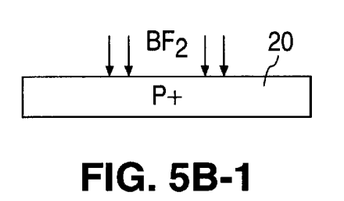
Figure 5B:
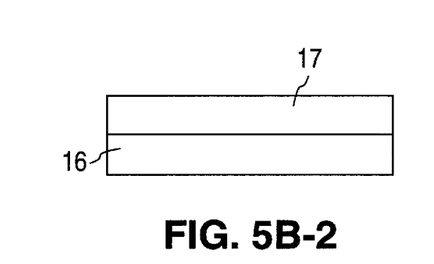

In FIGS. 5B-1 and 5B-2, a mask 17 is positioned such that $BF_2$ is implanted into the regions represented by silicon cross-section 16, forming heavily doped P+ silicon region 20.

Figure 5C:
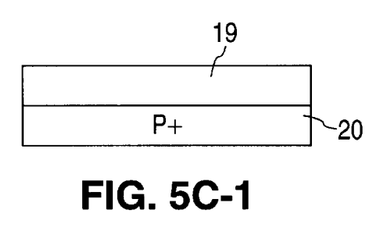
Figure 5C:
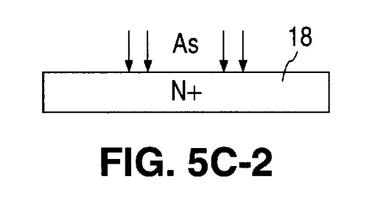
Figure 5D:
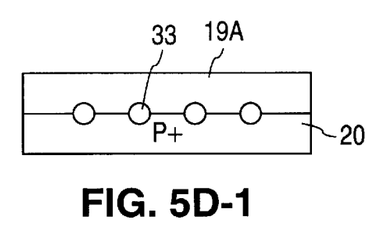
Figure 5D:
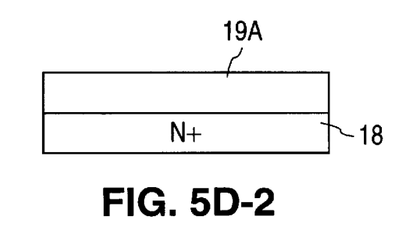
Figure 5E:
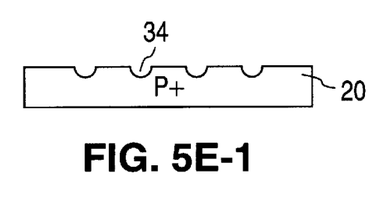
Figure 5E:
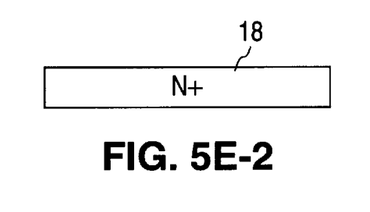

In FIGS. 5C-1 and 5C-2, a mask 19 is positioned over heavily doped P+ silicon region 20, and As is implanted into the regions represented by silicon cross-section 15, forming heavily N+ doped silicon region 18. A cap oxide 19A is then deposited over N+ doped silicon region 18 and P+ doped silicon region 20.

FIGS. 5D-1 and 5D-2 shows annealing of P+ and N+ doped silicon regions 20 and 18, and cap oxide 19A. Heat produced in this annealing step causes fluorine to outgas and form bubbles 33 in P+ doped region 20. Fluorine bubbles formed in P+ doped region 20 result from disassociation of fluorine from $BF_2$ implanted in FIG. 5B.

FIGS. 5E-1 and 5E-2 shows removal of cap oxide 19A. Because fluorine bubbles 33 have formed in P+ doped silicon region 20 during the annealing step shown in FIG. 5D, removal of cap oxide 19A exposes the surface of P+ doped silicon region 20 to be uneven due to pits 34.

Figure 5F:
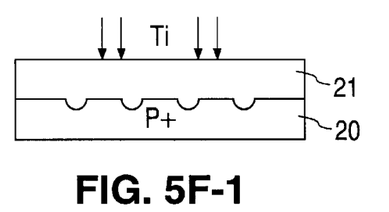
Figure 5F:
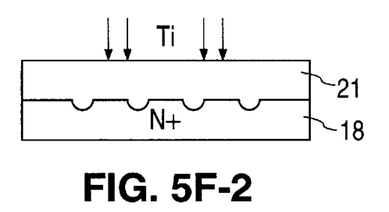

FIG. 5F-1 and 5F-2 shows the subsequent sputtering of titanium metal 21 upon the surfaces of both P+ doped silicon region 20 and N+ doped silicon region 18.

Figure 5G:
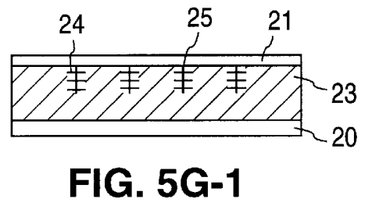
Figure 5G:
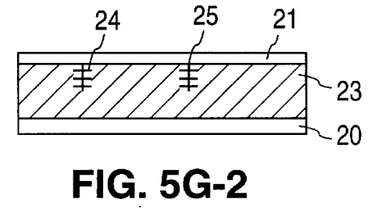
Figure 5H:
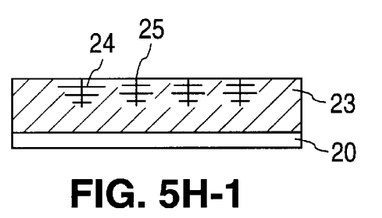
Figure 5H:
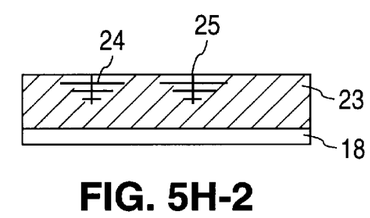
Figure 5I:
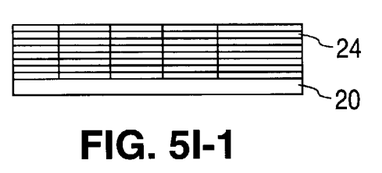
Figure 5I:
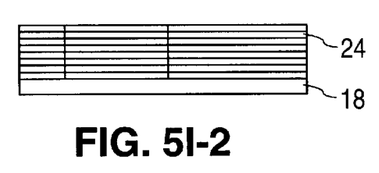

FIG. 5G-1 and 5G-2 shows the first sintering stage, which causes reaction of silicon with titanium to create titanium silicide. C-49 phase titanium silicide 23, represented by slashed lines, is the form of titanium silicide formed at this stage. Small amounts of the C-54 phase 24, shown by horizontal lines, form at nucleation sites 25, shown by single vertical lines.

FIG. 5H-1 and 5H-2 shows the removal of unreacted titanium metal 21 followed by second sintering stage, wherein higher sheet resistive C-49 phase titanium silicide 23 is transformed into lower sheet resistive C-54 titanium silicide 24. FIG. 5I-1 and 5I-2 show the second sintering stage, wherein higher sheet resistive C-49 phase titanium silicide 23 is transformed into lower sheet resistive C-54 phase titanium silicide 24. FIG. 5I-1 and 5I-2 show the second sintering stage, wherein higher sheet resistive C-49 phase titanium silicide 23 is transformed into lower sheet resistive C-54 phase titanium silicide 24.

Figure 6:
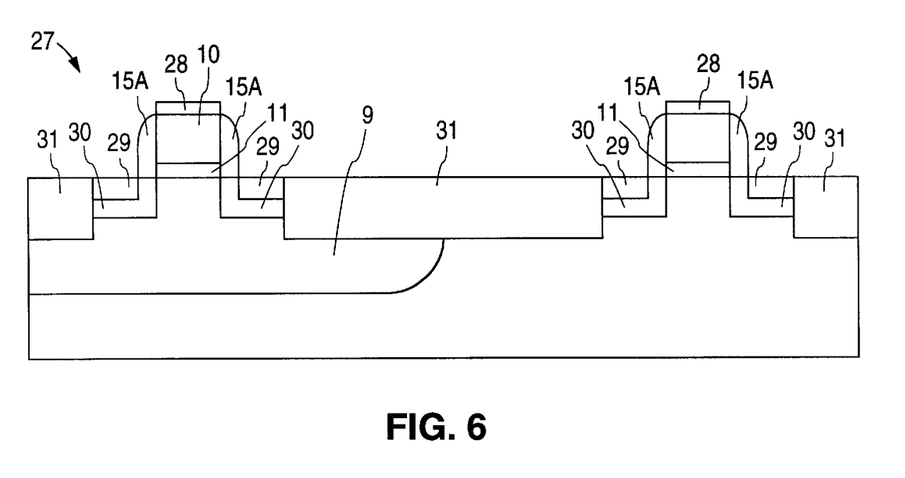
FIG. 6 shows a completed CMOS structure having silicided gate, drain, and source regions.

FIG. 6 shows the completed CMOS structure 27 having silicided, heavily-doped gates 28 and drain and source regions 29, lightly-doped regions 30, and nonsilicided spacer oxides 15A and field oxides 31.

While the conventional siliciding process is somewhat successful in creating layers of low resistance C-54 phase $TiSi_2$, as linewidths of semiconductor devices continue to shrink, the number of available nucleation sites will also decrease.

The present invention overcomes this problem by promoting the density of C-54 nucleation sites.

Figure 7A:
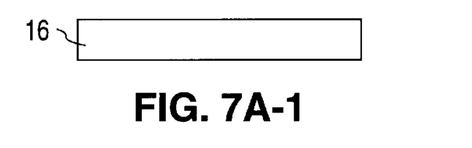
Figure 7A:
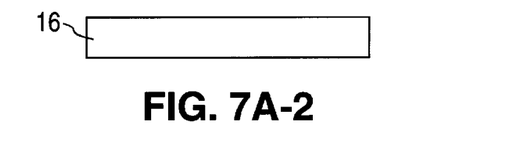

The process of the current invention also starts with the formation of precursor CMOS structure 7 shown in FIG. 4. FIGS. 7A-I to 7J-2 shows the process of forming titanium silicide in accordance with the present invention. FIGS. 7A-I to 7J-2 show the sequence of modifications made to the silicon layers 10, 12, 13, and 14 of FIG. 4. As shown in FIG. 7A-1, gate 10 or precursor source/drain regions 12 are generically indicated by left silicon cross-section 16. FIG. 7A-2 shows gate 13 or precursor source/drain regions 14 are generically indicated by right silicon cross-section 16.

Figure 7B:
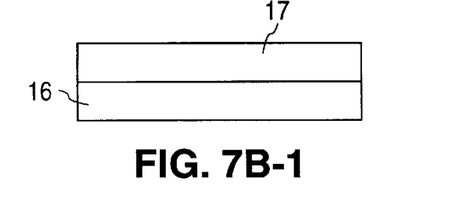
Figure 7B:
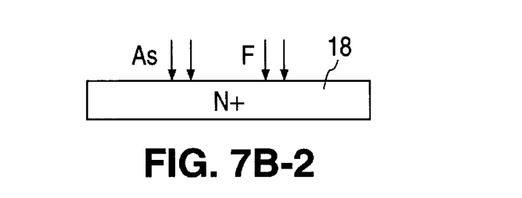

In FIGS. 7B-1 and 7B-2 mask 17 is positioned such that As is implanted into the silicon regions represented by cross-section 15, forming N+ silicon region 18. Fluorine is also implanted into the silicon regions represented by cross-section 15 using mask 17.

Figure 7C:
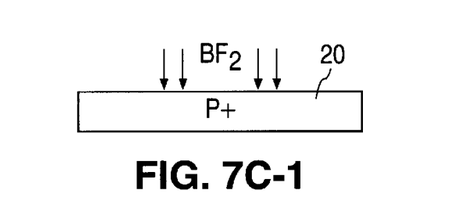
Figure 7C:
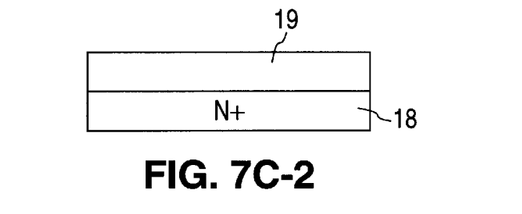
Figure 7D:
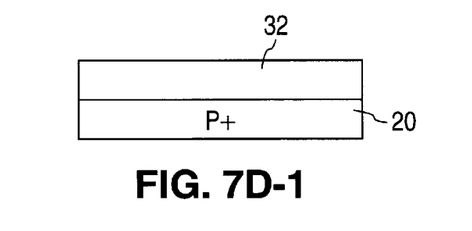
Figure 7D:
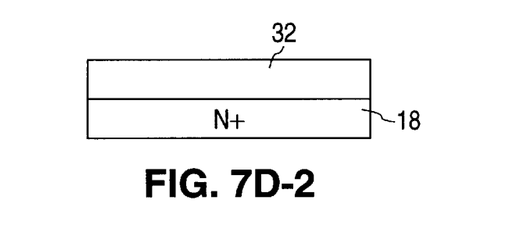
Figure 7E:
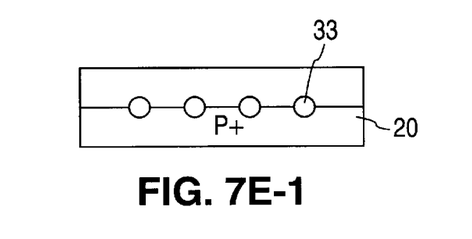
Figure 7E:
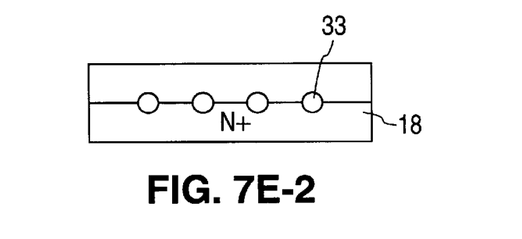
Figure 7F:
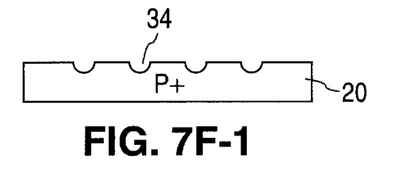
Figure 7F:
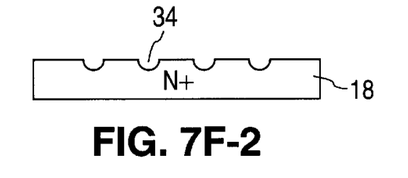

In FIGS. 7C-1 and 7C-2, mask 19 is then positioned over the N+ region 18, and $BF_2$ is implanted into the silicon regions represented by cross-section 16, forming heavily doped P+ silicon region 20.

FIGS. 7B-1 and and 7B-2 shows the formation of a cap oxide 32 over both P+ doped silicon region 20 and N+ doped silicon region 18, followed by annealing.

FIGS. 7E-1 and 7E-2 shows that heat produced in the annealing step causes fluorine to outgas and form bubbles 33 in both N+ doped region 18 and P+ doped region 20. Fluorine bubbles 33 formed in N+ doped region 18 result from the fluorine implanted in FIG. 7B. Fluorine bubbles formed in P+ doped region 20 result from disassociation of fluorine from $BF_2$ implanted in FIG. 7C.

FIGS. 7F-1 and 7F-2 shows removal of cap oxide 32. Because fluorine bubbles 33 have formed in both N+ doped silicon region 18 and P+ doped silicon region 20 during the annealing step shown in FIG. 7D, removal of cap oxide 32 exposes the surface of P+ doped silicon region 20 and N+ doped silicon region 18 to be uneven due to pits 34.

Figure 7G:
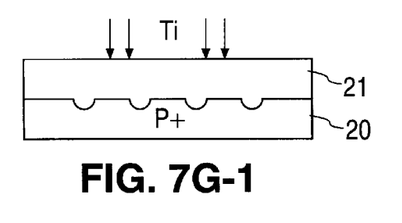
Figure 7G:
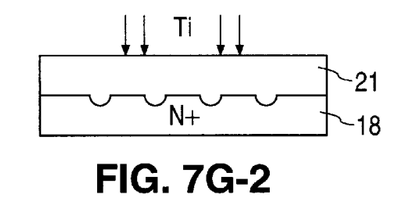

FIGS. 7G-1 and 7G-2 shows the subsequent sputtering of titanium metal 21 upon the pitted surfaces of both P+ doped silicon region 20 and N+ doped silicon region 18.

Figure 7H:
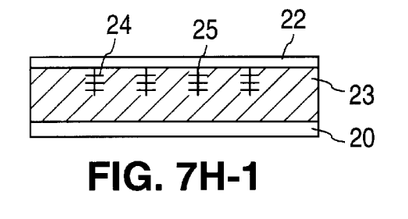
Figure 7H:
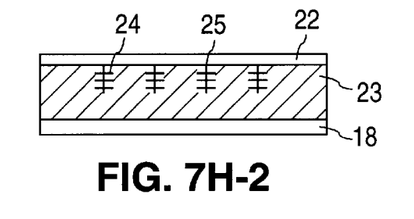
Figure 7I:
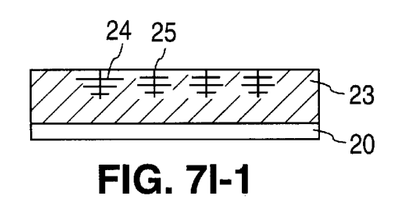
Figure 7I:
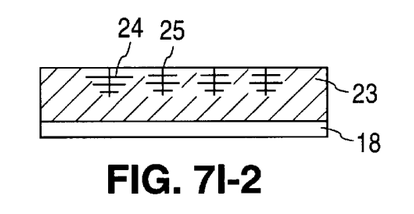
Figure 7J:
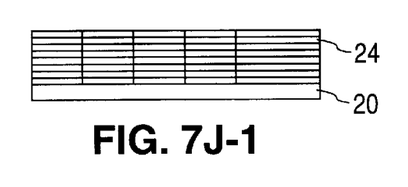
Figure 7J:
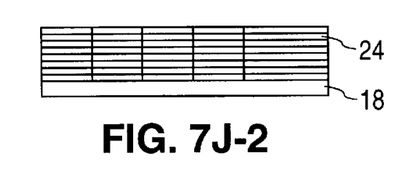

FIGS. 7H-1 and 7H-2 shows the first sintering stage, which causes reaction of silicon with titanium to create titanium silicide. C-49 phase titanium silicide 23, represented by slashed lines, is the form of titanium silicide formed at this stage. Small amounts of the C-54 phase 24, shown by horizontal lines, form at nucleation sites 25, shown by single vertical lines.

FIG. 7H-1 and 7H-2 shows the removal of unreacted titanium metal. FIG. 7H-1 and 7H-2 shows the second sintering stage, wherein higher sheet resistive C-49 phase titanium silicide 23 is transformed into lower sheet resistive C-54 titanium silicide 24.

FIGS. 7A-1 to 7J-2 roughly depict an increase in nucleation site density as compared with FIGS. 5A-1 to 5H-2.

This increase in the number of nucleation sites is attributable to pits 34 created by outgassing fluorine at the annealing step shown in FIG. 7C.

FIG. 6 again shows a completed CMOS structure 27 having silicided, heavily-doped gates 28 and drain and source regions 29, and nonsilicided spacer oxides 15A and field oxides 31.

It is important to note that the specific process steps shown in FIGS. 7A-1 to 7J-2 represent merely one of many embodiments for improving sheet resistance in accordance with the present invention. While the description of FIG. 7B-2 describes implantation of arsenic followed by fluorine into the silicon regions represented by cross-section 15, the order of implantation of fluorine and arsenic may be reversed. And while FIG. 7B-2 depicts implantation of fluorine into heavily doped N+ doped silicon region 18 prior to formation of cap oxide 32, fluorine may in fact be implanted into N+ doped silicon region 18 after formation of cap oxide 32, but before the annealing step occurs. Moreover, the inventor believes that implanted compounds other than fluorine, such as chlorine, may have volatility and etching characteristics that render them suitable for use in accordance with the present invention.

The CMOS transistor shown in FIG. 6 represents merely one embodiment of the structures suited for the formation of titanium silicide in accordance with the present invention. Bipolar transistors and other MOS configured transistors, as well as interconnect lines forming linkages between semiconductor devices, are also suitable for formation of silicides under the present invention.

Therefore, it is intended that the following claims define the scope of the invention, and that methods and structures within the scope of these claims and their equivalents be covered thereby.

What is claimed is:

1. A method of forming silicide on the surface of silicon comprising the steps of:

implanting a volatile compound into the silicon;

covering the surface of the silicon with a cap material;

heating the silicon such that the implanted volatile compound causes gas bubbles to form in the silicon;

removing the cap material; and exposing the silicon to a refractory metal.

2. The method of claim 1 wherein the step of implanting a volatile compound into the silicon includes implanting elemental fluorine into the silicon.

3. The method of claim 1 wherein the step of covering the surface of the silicon with a cap material includes covering the surface of the silicon with a cap of silicon oxide.

4. The method of claim 1 wherein the step of exposing the silicon to refractory metal includes exposing the silicon to titanium.

5. A method of forming silicide on silicon comprising the steps of:

introducing fluorine into silicon;

forming a cap oxide over the silicon;

annealing the silicon;

removing the cap oxide;

forming a layer of a refractory metal upon the silicon; and heating the silicon such that outgassing of fluorine during the annealing step enhances reaction of silicon with refractory metal to form silicides.

6. The method of claim 5 wherein the step of introducing fluorine into silicon includes introducing fluorine into N+ doped regions and P+ doped regions of the silicon.

7. The method of claim 6 wherein the step of introducing fluorine into silicon includes introducing fluorine into P+ doped regions by implanting $BF_2$, and introducing fluorine into N+ doped regions by implanting elemental fluorine.

8. The method of claim 7 wherein the step of heating the silicon includes heating the silicon at a first temperature, and then heating the silicon at a second temperature, such that the first temperature is lower than the second temperature.

9. A method of forming titanium silicide on silicon comprising the steps of:

implanting $BF_2$ into selected regions of silicon to form P+ doped regions;

implanting an N type dopant into selected regions of silicon to form N+ doped regions;

implanting fluorine into the N+ doped regions;

forming a cap oxide over the N+ doped regions and the P+ doped regions;

annealing the silicon and the cap oxide;

removing the cap oxide;

forming a layer of titanium on the N+ doped regions and the P+ doped regions; and heating the N+ doped regions and the P+ doped regions, whereby $TiSi_2$ having low sheet resistance is formed.

10. The method of claim 9 wherein the step of implanting fluorine into the N+ doped regions occurs after the cap oxide is formed.

11. The method of claim 9 wherein the step of heating the N+ doped regions and the P+ doped regions includes heating the N+ doped regions and the P+ doped regions at a first temperature, and then heating the N+ doped regions and the P+ doped regions at a second temperature, such that the first temperature is lower than the second temperature.

12. A method of forming $TiSi_2$ on the surface of N+ doped regions of a silicon structure comprising the steps of:

implanting fluorine into an N+ doped region of a silicon structure;

forming a cap oxide over the surface of the N+ doped region;

annealing the N+ doped region and cap oxide;

removing the cap oxide;

forming a layer of Ti upon the N+ doped region; and heating the N+ doped region.

* * * * *